(12) United States Patent
Chen et al.

(10) Patent No.: US 8,513,749 B2
(45) Date of Patent: Aug. 20, 2013

(54) COMPOSITE HARDMASK ARCHITECTURE AND METHOD OF CREATING NON-UNIFORM CURRENT PATH FOR SPIN TORQUE DRIVEN MAGNETIC TUNNEL JUNCTION

(75) Inventors: Wei-Chuan Chen, Taipei (TW); Seung H. Kang, San Diego, CA (US); Xiaochun Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 296 days.

(21) Appl. No.: 12/687,426

(22) Filed: Jan. 14, 2010

(65) Prior Publication Data

US 2011/0169112 A1    Jul. 14, 2011

(51) Int. Cl.
  *H01L 29/82* (2006.01)
(52) U.S. Cl.
  USPC ............ 257/421; 257/E29.923; 257/E21.002; 438/3
(58) Field of Classification Search
  USPC ............... 257/421, E29.923, E21.002; 438/3
  See application file for complete search history.

(56) References Cited

U.S. PATENT DOCUMENTS

| | | | |
|---|---|---|---|
| 6,417,561 B1 | 7/2002 | Tuttle | |
| 7,372,722 B2 * | 5/2008 | Jeong et al. | 365/158 |
| 2002/0097537 A1 * | 7/2002 | Shimazawa | 360/324.2 |
| 2005/0254287 A1 | 11/2005 | Valet | |
| 2006/0002184 A1 * | 1/2006 | Hong et al. | 365/171 |
| 2006/0011958 A1 * | 1/2006 | Jeong et al. | 257/295 |
| 2006/0148234 A1 * | 7/2006 | Chen et al. | 438/618 |
| 2007/0171694 A1 | 7/2007 | Huai et al. | |
| 2008/0160643 A1 * | 7/2008 | Park et al. | 438/3 |
| 2008/0180991 A1 | 7/2008 | Wang | |
| 2008/0191251 A1 | 8/2008 | Ranjan et al. | |
| 2008/0225585 A1 * | 9/2008 | Ranjan et al. | 365/173 |
| 2009/0261435 A1 | 10/2009 | Takada et al. | |

OTHER PUBLICATIONS

Chung N L et al: "Effects of capping layer on the spin accumulation and spin torque in magnetic multilayers; Effects of capping layer", Journal of Physics D. Applied Physics, IOP Publishing, Bristol, GB, vol. 42, No. 19, Oct. 7, 2009, p. 195502, XP020163452, ISSN: 0022-3727, DOI: D0I:10.1088/0022-3727/42/19/195502 the whole document.
International Search Report and Written Opinion—PCT/US2011/021376-ISA/EPO—Jul. 28, 2011.
Sun et al: "Magnetoresistance and spin-transfer torque in magnetic tunnel junctions", Journal of Magnetism and Magnetic Materials, Elsevier Science Publishers, Amsterdam, NL, vol. 320, No. 7, Jan. 14, 2008 pages 1227-1237, XP022511154, ISSN: 0304-8853, DOI: DOI:10.1016/J.JMMM.2007.12.008 the whole document.

(Continued)

*Primary Examiner* — Trung Q Dang
(74) *Attorney, Agent, or Firm* — Sam Talpalatsky; Nicholas J. Pauley; Joseph Agusta

(57) ABSTRACT

A magnetic tunnel junction (MTJ) storage element and method of forming the MTJ are disclosed. The magnetic tunnel junction (MTJ) storage element includes a pinned layer, a barrier layer, a free layer and a composite hardmask or top electrode. The composite hardmask/top electrode architecture is configured to provide a non-uniform current path through the MTJ storage element and is formed from electrodes having different resistance characteristics coupled in parallel. An optional tuning layer interposed between the free layer and the top electrode helps to reduce the damping constant of the free layer.

35 Claims, 8 Drawing Sheets

(56) References Cited

OTHER PUBLICATIONS

Chih-Liang Wang, et al., "Reduction in Critical Current Density by Tuning Damping 26-31 Constants of CoFeB for Spin-Torque-Transfer Switching", Journal of Physics D. Applied Physics, IOP Publishing, Bristol, GB, vol. 42, No. 11, Jun. 7, 2009.

Yang T et al., "Roles of spin-polarized current and spin accumulation in the current-induced magnetization switching", Journal of Magnetism and Magnetic Materials, Elsevier Science Publishers, Amsterdam,NL, vol. 301, No. 2, Jun. 1, 2006, pp. 389-397,XP024984403,ISSN:0304-8853,DOI:DO1:10.1016/J.JMMM. 2005.07.013 abstract; figures 3a,3c p. 389, left-hand column, line1-page 390, left-hand column, line8.

\* cited by examiner

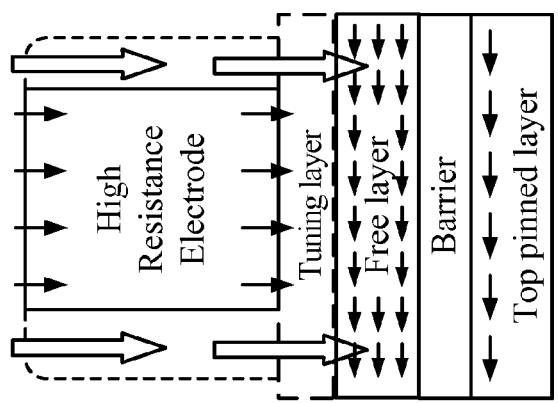
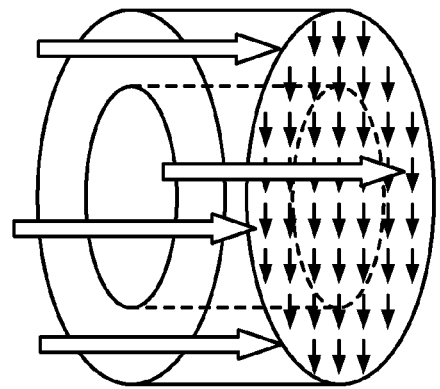
FIG. 4C
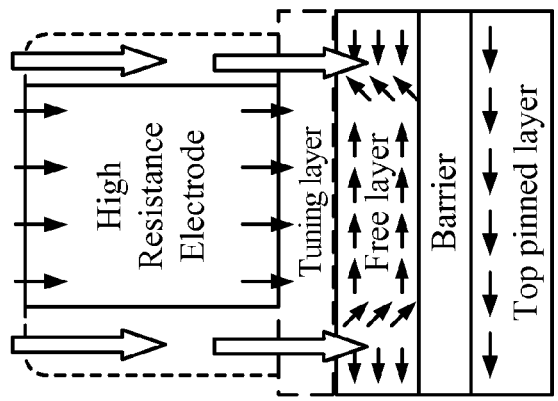
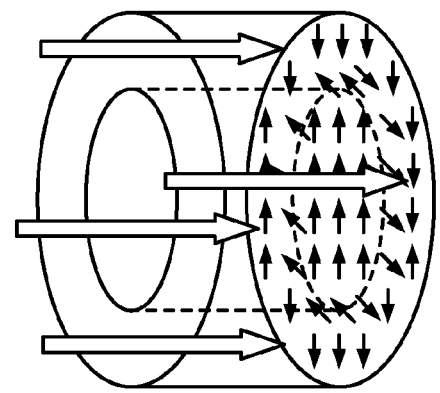
FIG. 4B
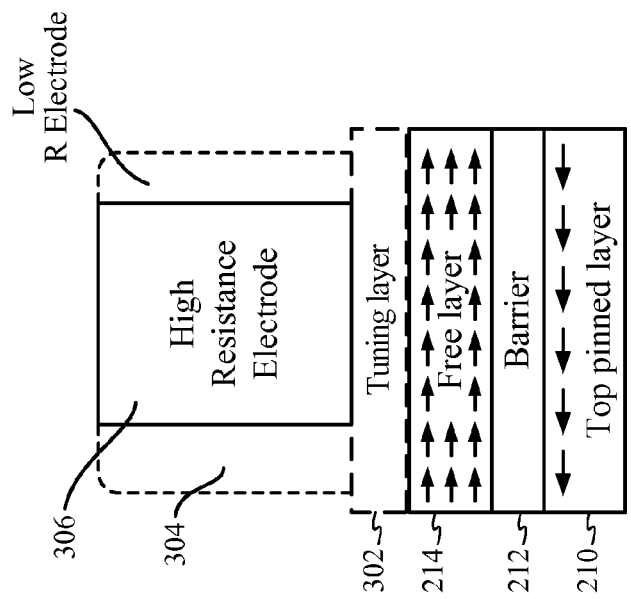
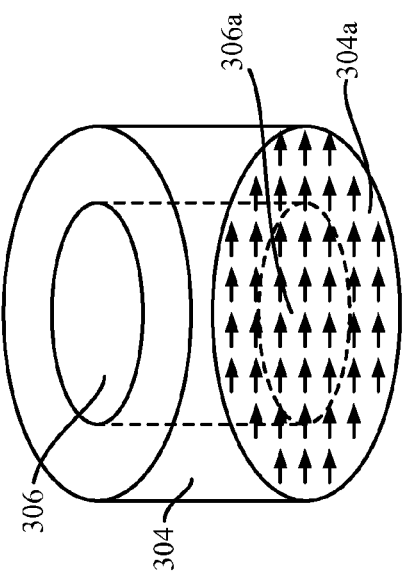
FIG. 4A

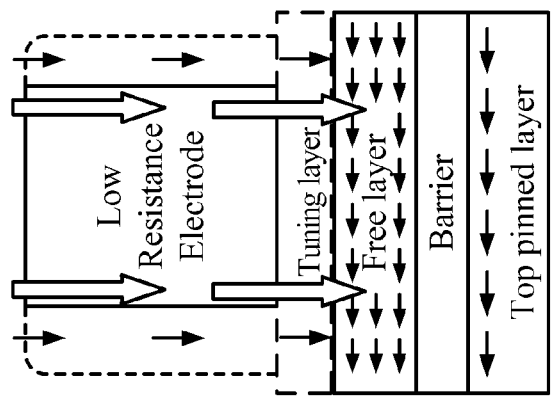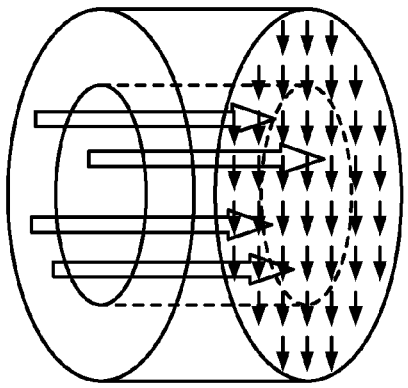
FIG. 5C
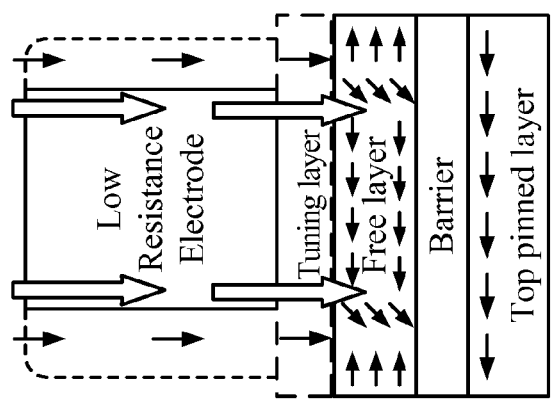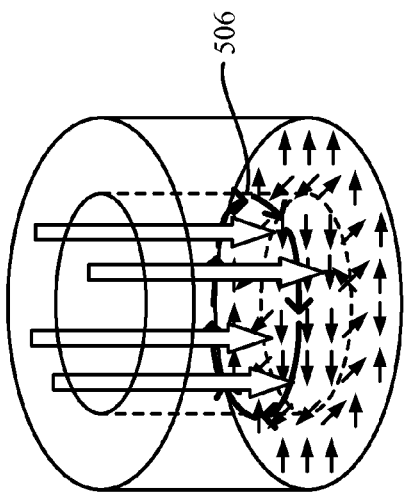
FIG. 5B
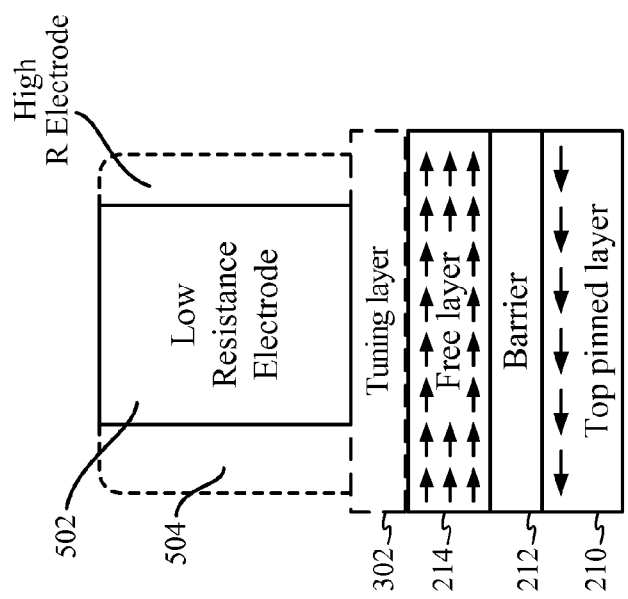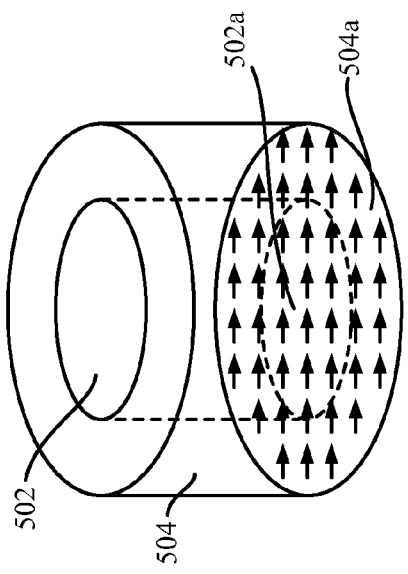
FIG. 5A

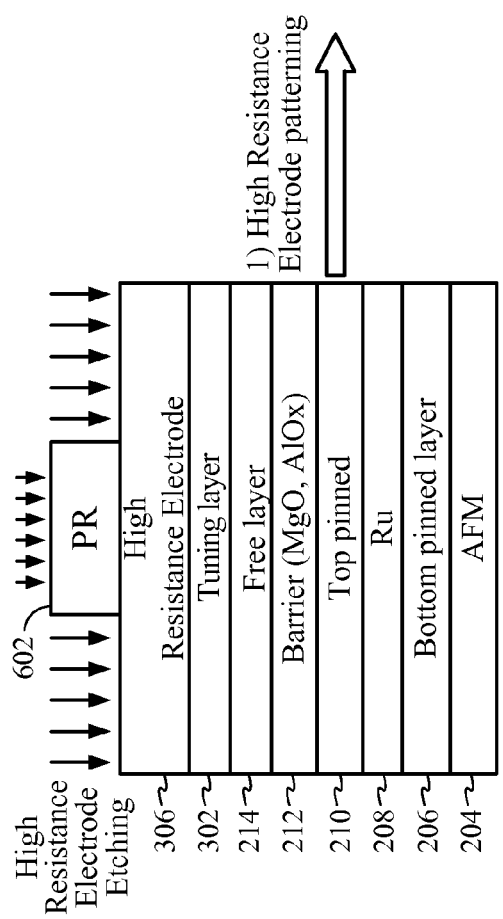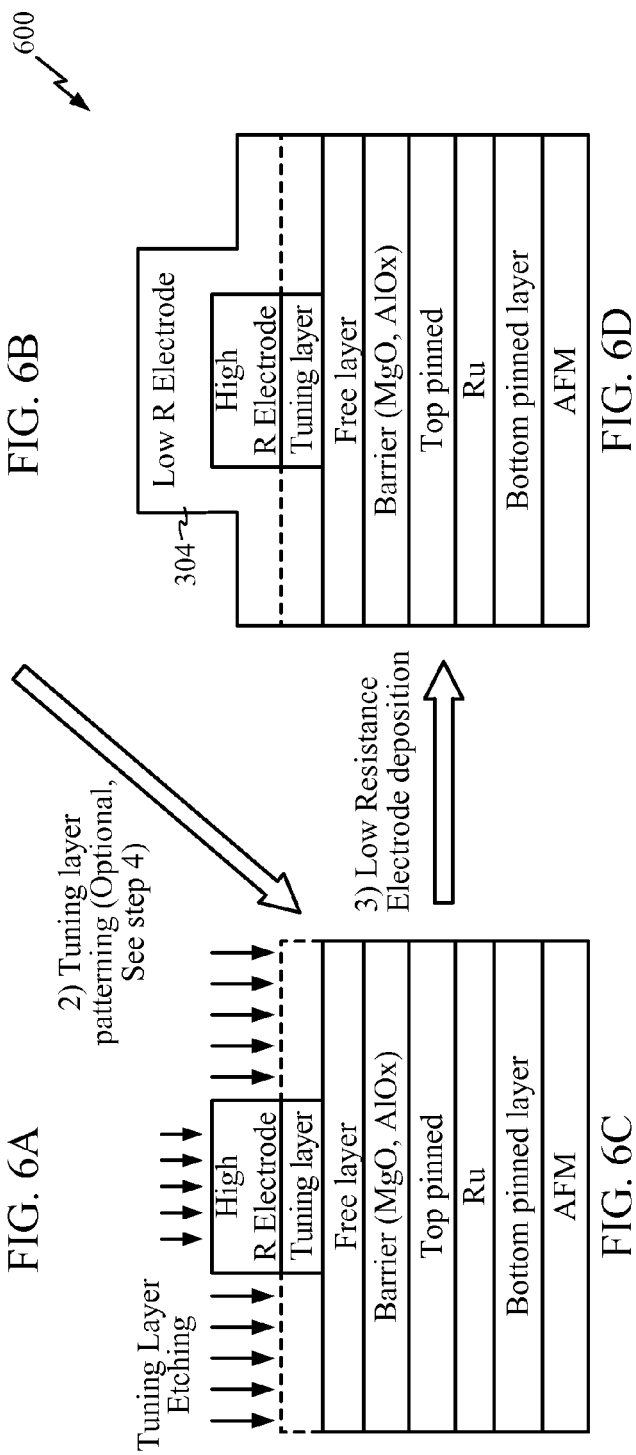
FIG. 6A
FIG. 6B
FIG. 6C
FIG. 6D

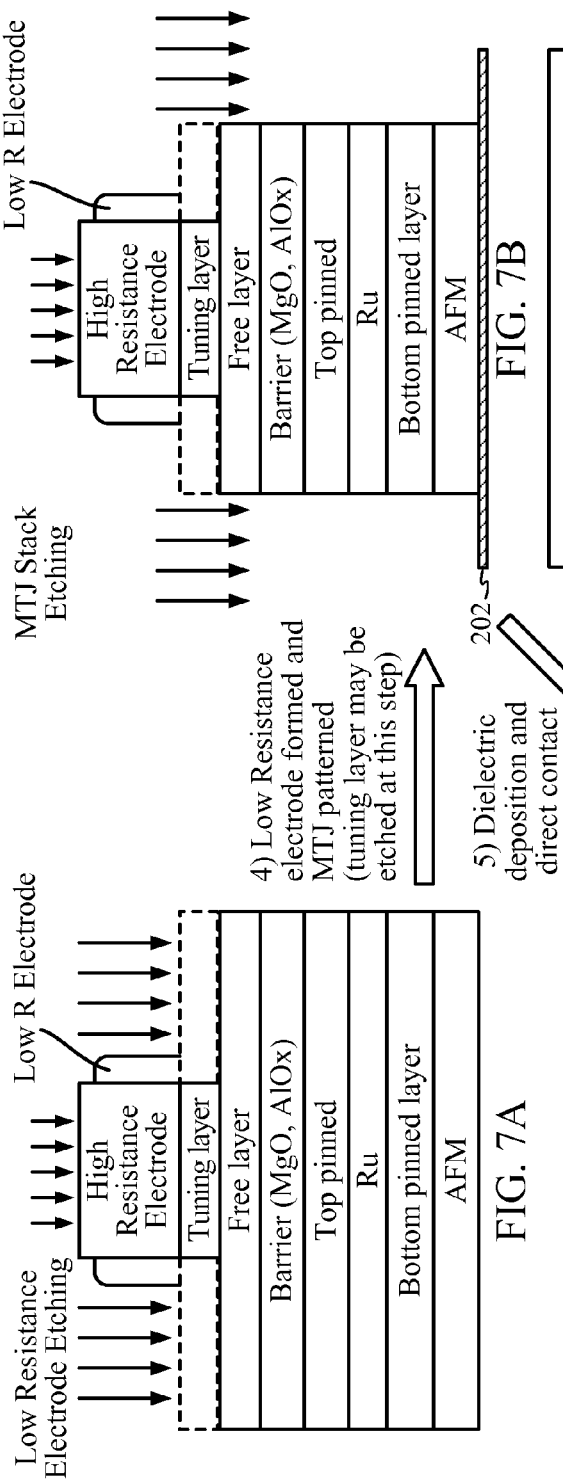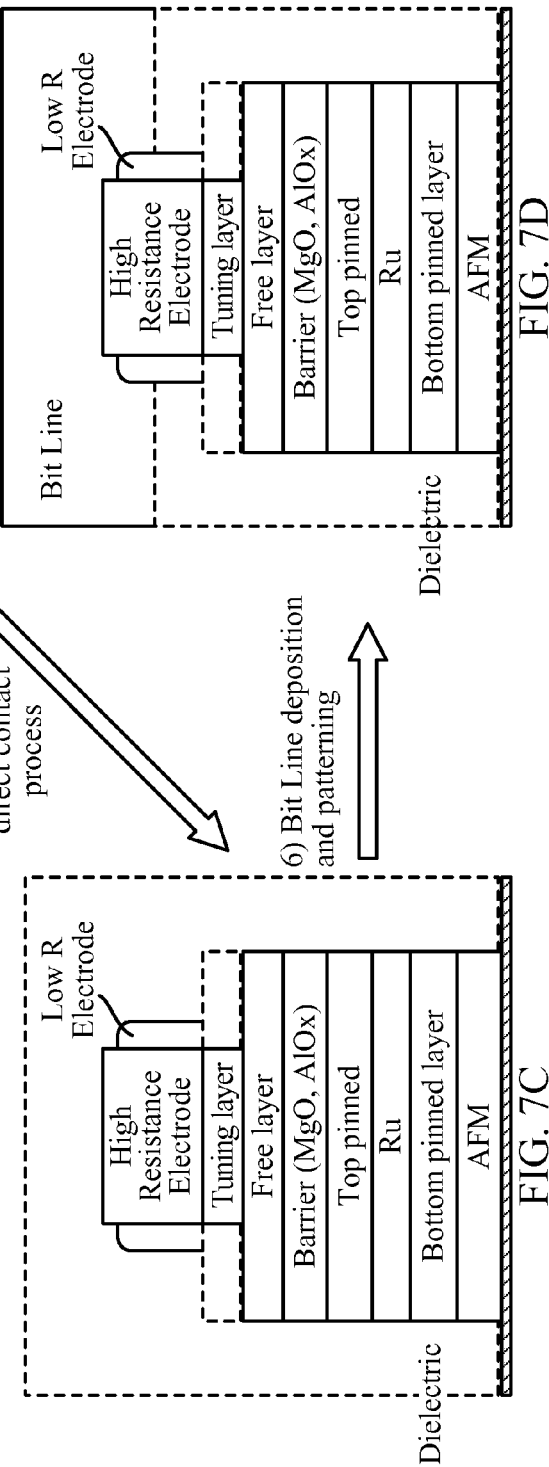

COMPOSITE HARDMASK ARCHITECTURE AND METHOD OF CREATING NON-UNIFORM CURRENT PATH FOR SPIN TORQUE DRIVEN MAGNETIC TUNNEL JUNCTION

FIELD OF DISCLOSURE

Disclosed embodiments are related to a composite hardmask architecture in a Magnetic Tunnel Junction (MTJ) storage element and methods for creating non-uniform current paths for Spin Torque driven MTJs.

BACKGROUND

Magnetoresistive Random Access Memory (MRAM) is a non-volatile memory technology that uses magnetic elements. For example, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM).

FIG. 1 illustrates a conventional STT-MRAM bit cell 100. The STT-MRAM bit cell 100 includes magnetic tunnel junction (MTJ) storage element 105, a transistor 101, a bit line 102 and a word line 103. The MTJ storage element is formed, for example, from at least two ferromagnetic layers (a pinned layer and a free layer), each of which can hold a magnetic field or polarization, separated by a thin non-magnetic insulating layer (tunneling barrier). Electrons from the two ferromagnetic layers can penetrate through the tunneling barrier due to a tunneling effect under a bias voltage applied to the ferromagnetic layers. The spin polarized electrons tunneling through to the free layer may transfer their torque or angular momentum to the magnetic elements of the free layer, thus affecting the magnetic polarization of the free layer.

The magnetic polarization of the free layer can be reversed so that the polarity of the pinned layer and the free layer are either substantially aligned (parallel) or opposite (anti-parallel). The resistance of the electrical path through the MTJ will vary depending on the alignment of the polarizations of the pinned and free layers. This variance in resistance can be used to program and read the bit cell 100. The STT-MRAM bit cell 100 also includes a source line 104, a sense amplifier 108, read/write circuitry 106 and a bit line reference 107.

For example, the bit cell 100 may be programmed such that a binary value "1" is associated with an operational state wherein the polarity of the free layer is parallel to the polarity of the pinned layer. Correspondingly, a binary value "0" may be associated with an anti-parallel orientation between the two ferromagnetic layers. A binary value may thus be written to the bit cell by changing the polarization of the free layer. A sufficient current density (typically measured in Amperes/centimeter$^2$) generated by the electrons flowing across the tunneling barrier is required to change the polarization of the free layer. The current density required to switch the polarization of the free layer is also called switching current density. Decreasing the value of the switching current density leads to beneficially lowering the power consumption of the MTJ cells. Additionally, lower switching current density enables smaller device dimensions and a correspondingly higher density of MTJ cells in an STT-MRAM integrated circuit.

The switching current density is dependent on the ability of electrons flowing across the tunneling barrier to efficiently transfer their spin torque to the magnetic elements of the free layer. Introducing a non-uniformity in the electrical current path created by the flow of electrons can advantageously lead to a more efficient transfer of the spin torque, thereby leading to a more efficient switching behavior and lower switching current density. However, conventional MTJ architectures promote a uniform current path across the MTJ bit cell. Accordingly, there is a need for architectures which can promote a non-uniform current path across the MTJ bit cells.

SUMMARY

Exemplary embodiments of the invention are directed to apparatuses related to a Magnetic Tunnel Junction (MTJ) and Spin Transfer Torque Magnetoresistive Random Access Memory (STT-MRAM) cell and to methods of forming the same. More particularly, embodiments are related to a composite hardmask architecture in a Magnetic Tunnel Junction (MTJ) storage element of an STT-MRAM cell and methods for creating non-uniform current paths for Spin Torque driven MTJs.

For example, an exemplary embodiment includes an MTJ storage element, the MTJ storage element comprising a pinned layer, a barrier layer and a free layer; and a top electrode formed on top of the free layer, wherein the top electrode is configured to provide a non-uniform current path through the MTJ storage element. In an exemplary embodiment, a tuning layer is optionally interspersed between the free layer and the top electrode.

Another exemplary embodiment is directed to a method of forming an MTJ storage element, the method comprising forming an MTJ, comprising a pinned layer, a barrier layer and a free layer; forming an inner top electrode on the free layer; patterning the inner top electrode utilizing lithography and etching; and forming an outer top electrode on the inner top electrode, encapsulating the inner top electrode; etching the outer top electrode; and etching the MTJ utilizing the outer top electrode and the inner top electrode as a mask.

Another exemplary embodiment is directed to a magnetic tunnel junction (MTJ) storage element comprising: a bottom conductive means for electrically coupling the MTJ storage element, a first magnetic means for holding a first polarization, first insulating means to facilitate the flow of tunneling current and a second magnetic means for holding a second polarization, wherein the second polarization is reversible; damping means for a reducing damping constant of the second magnetic means formed on top of the second magnetic means; inner top conductive means for electrically coupling the MTJ storage element, the inner top conductive means being adjacent to the damping means; and outer top conductive means for electrically coupling the MTJ storage element, the outer top conductive means positioned outside the first top conductive means and electrically parallel to the inner top conductive means.

Another exemplary embodiment is directed to a method of forming a magnetic tunnel junction (MTJ) storage element, the method comprising: step for forming an MTJ, comprising a pinned layer, a barrier layer and a free layer; step for forming an inner top electrode on the free layer; step for patterning the inner top electrode utilizing lithography and etching; and step for forming an outer top electrode on the inner top electrode, encapsulating the inner top electrode; step for etching the outer top electrode; and step for etching the MTJ utilizing the outer top electrode and the inner top electrode as a mask.

BRIEF DESCRIPTION OF THE DRAWINGS

The accompanying drawings are presented to aid in the description of embodiments of the invention and are provided solely for illustration of the embodiments and not limitation thereof.

FIG. 4 shows cross-sectional and projection views of sections of an exemplary MTJ bit cell according to FIG. 3. FIG. 4 illustrates the magnitude of current flow through different sections of the composite top electrode. FIG. 4 also illustrates switching activity within the free layer of the MTJ bit cell according to an exemplary embodiment.

FIG. 5 provides similar information as FIG. 4 for an exemplary MTJ bit cell with a different architecture of the composite top electrode.

FIG. 6 and FIG. 7 are schematic cross-sectional views of an MTJ bit cell during various stages of manufacture.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation. The terminology used herein is for the purpose of describing particular embodiments only and is not intended to be limiting of embodiments of the invention.

As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The disclosed embodiments recognize that a non-uniform current path across the MTJ bit cell can advantageously lead to a lower switching current density. This recognition stems from the fact that focusing a high number of spin polarized electrons in a localized region within the free layer leads to higher "switching activity" in the localized region. Here, switching activity refers to the process wherein the spin polarized electrons transfer their spin torque to polarize the magnetic elements of the ferromagnetic free layer. The higher switching activity within the localized region transfers momentum to surrounding regions within the free layer, which are thus enabled to switch under the influence of a lower number of spin polarized electrons. Correspondingly a confined high density current path supplied to a localized region of the free layer promotes efficient switching activity in the free layer.

Figure 1:
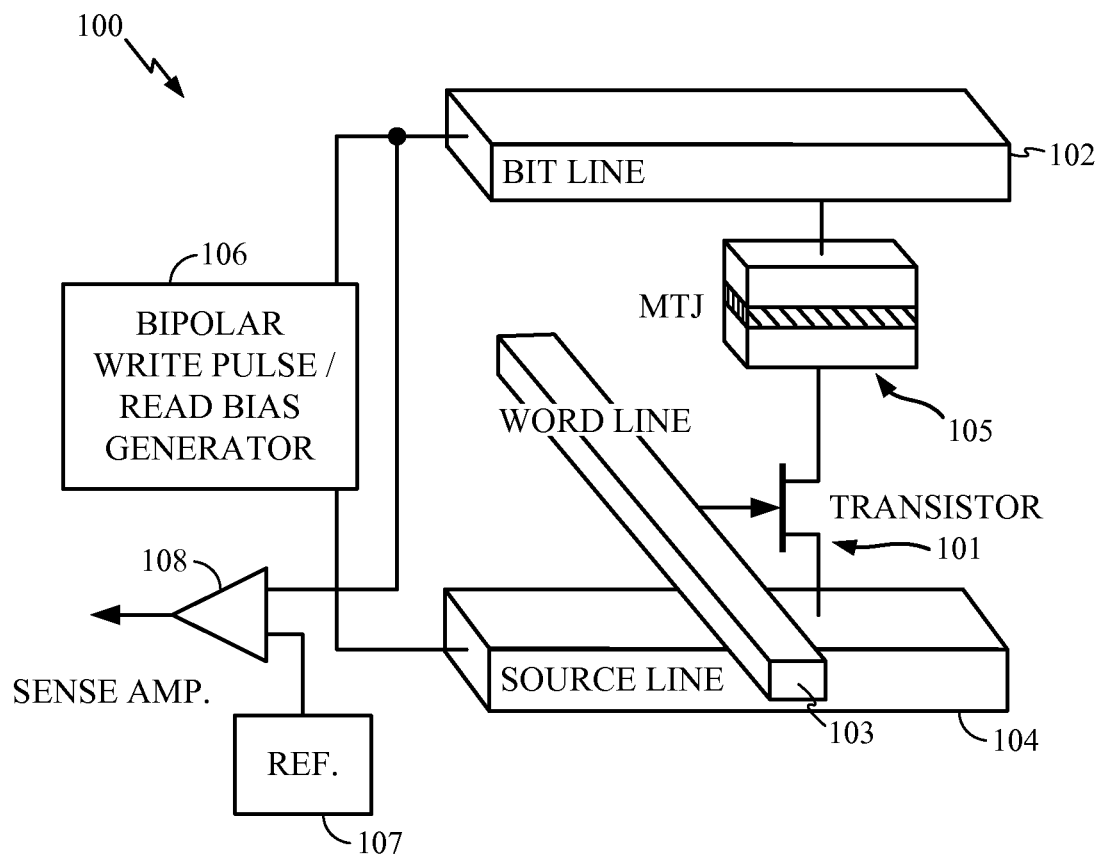
FIG. 1 is an illustration of a conventional Spin Transfer Torque Magnetoresistive Random Access Memory (STT-MRAM) cell array.
Figure 2:
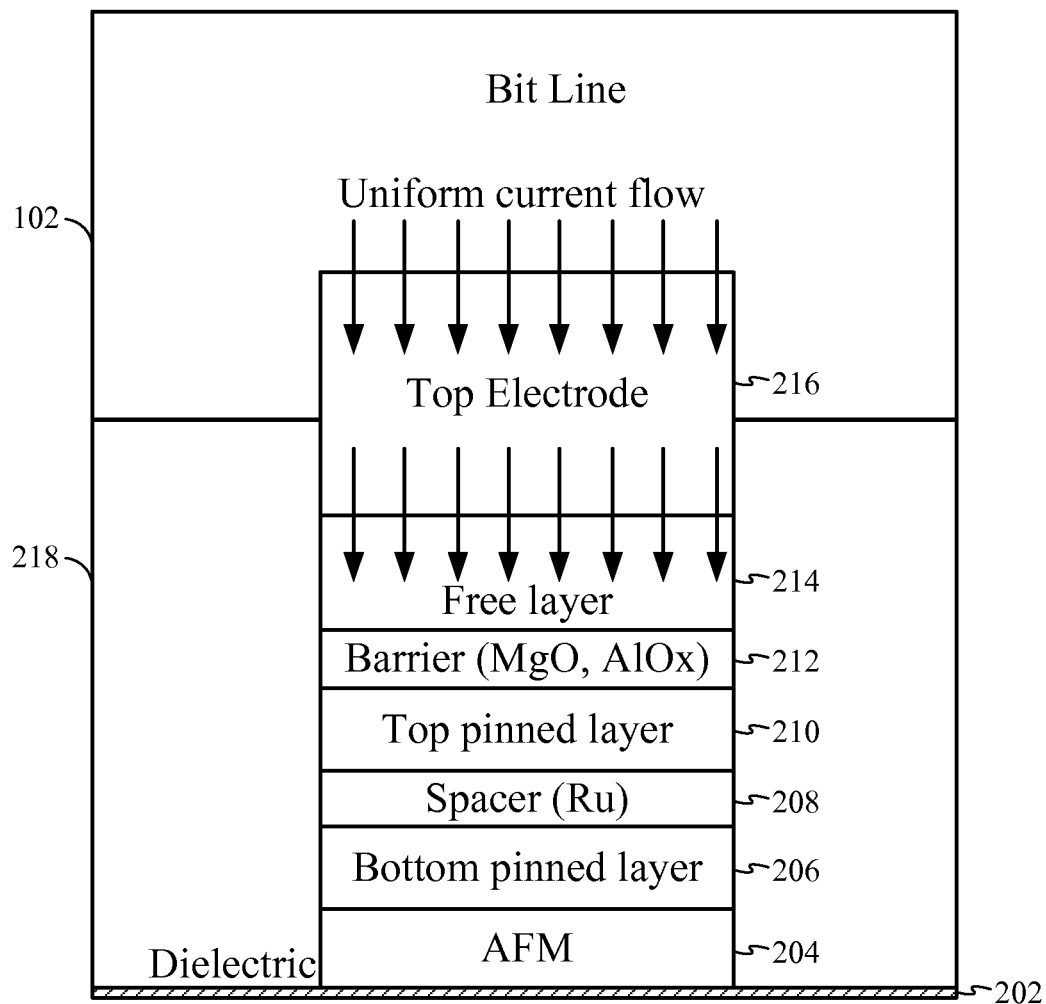
FIG. 2 is a cross-sectional view of a conventional MTJ bit cell.

FIG. 2 shows the cross-sectional view of a conventional MTJ architecture with a uniform current flow across the MTJ bit cell. It is well known in the art that the direction of current is denoted as opposite to the direction of the flow of electrons. A uniform current flow is illustrated in FIG. 2 from the metal layer or bit line 102 towards the free layer 214, through the top electrode or hardmask layer 216. The free layer 214 may include a single layer, or may be formed from a multi layer stack. FIG. 2 also illustrates the bottom electrode 202 on which the MTJ bit cell is formed, an antiferromagnetic layer 204, a pinned layer comprising of a bottom pinned layer 206, a spacer layer 208 and a top pinned layer 210 and the tunneling barrier 212. The interlayer dielectric 218 assists in isolating the MTJ bit cells.

Figure 3:
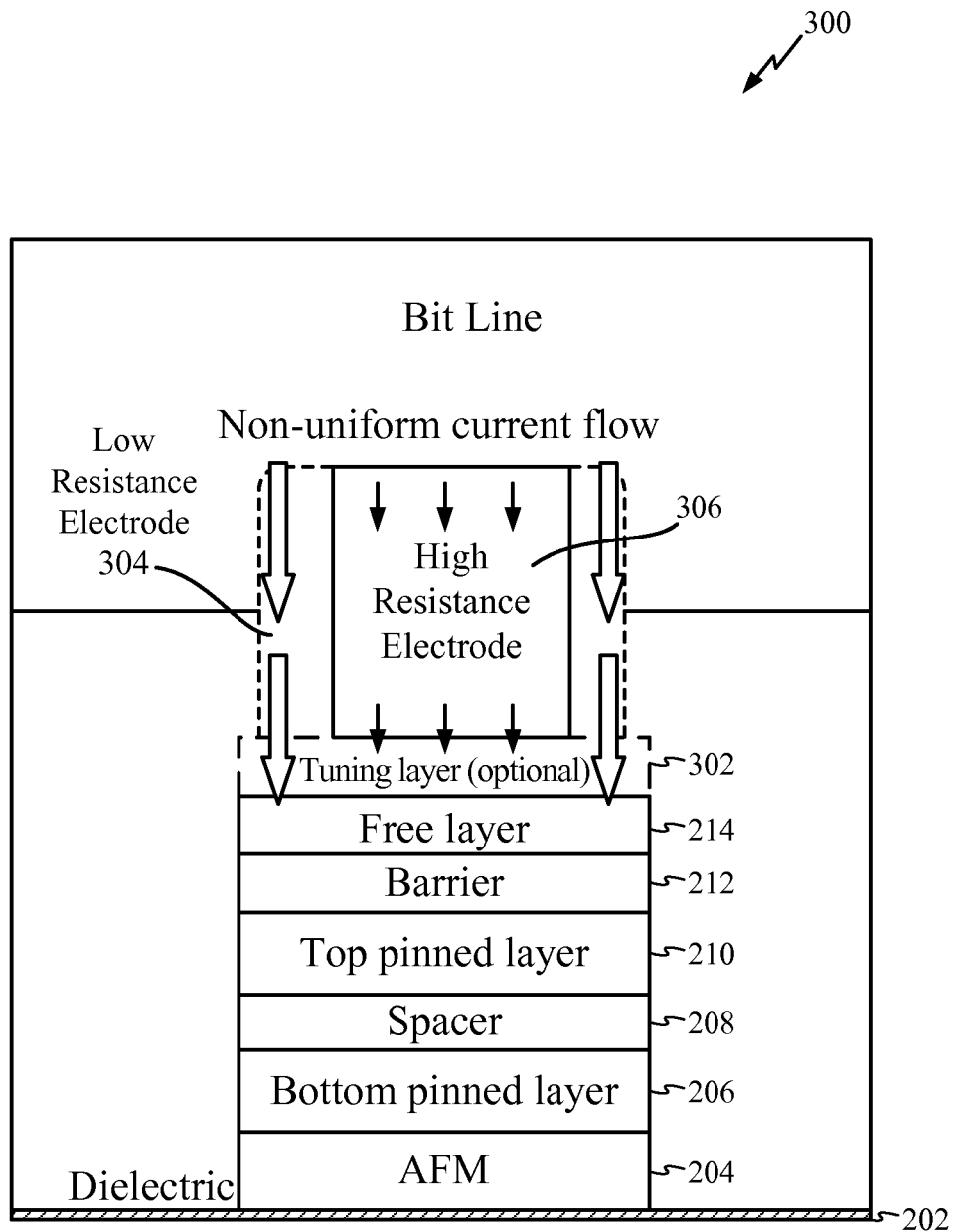
FIG. 3 is a cross-sectional view of an exemplary MTJ bit cell with a composite top electrode architecture and an optional tuning layer.

An exemplary embodiment which incorporates improvements over the conventional MTJ architecture according to the teachings disclosed herein is illustrated in FIG. 3. As illustrated in FIG. 3, the top electrode of the MTJ cell 300 may include a low resistance electrode 304 and a high resistance electrode 306. The low resistance electrode 304 may form a surrounding region around the high resistance electrode 306 as shown in FIG. 3. An optional tuning layer 302 may also be formed over the free layer 214 to protect the free layer 214 from process related defects, and to optimize the properties of free layer 214. A tuning layer 302 formed of a material with low damping constant may assist the switching activity of the free layer 214. As suggested in FIG. 3, the tuning layer 302 may be formed such that it is in contact with the low resistance electrode 304, the high resistance electrode 306 and the free layer 214 in an exemplary embodiment. Alternately, the tuning layer 302 may be formed such that it is only in contact with only the high resistance electrode 306 and the free layer 214. The remaining layers can include conventional arrangements and materials as previously described in relation to FIG. 2 and will not be further described herein. The process steps for fabricating exemplary embodiments will be provided in subsequent sections of this disclosure.

FIGS. 4A-4C illustrates cross-sectional views and three dimensional projection views (top view) of relevant sections of an exemplary MTJ cell. The low resistance electrode 304 forms a concentric shell or layer surrounding the high resistance electrode 306. As described previously, an anti-parallel alignment between the free layer 214 and the pinned layer 210 may represent a binary value "0" stored in the MTJ bit cell 300. FIG. 4A illustrates the polarization of the entire free layer 214 as anti-parallel to the polarization of the top pinned layer 210. For purposes of this illustration, we assume that FIG. 4A represents initial conditions at say, time "t0", when the word line 103 is deactivated and a binary value "0" is stored in the MTJ bit cell 300.

Correspondingly, FIG. 4B illustrates the operation of the MTJ cell 300 at time "t1" when the word line 103 is activated, the bit line 102 is active high and the source line 103 is active low. At time t1, the MTJ bit cell 300 is thus "selected" and an operation to write a binary value "1" is initiated. The spin polarized electrons flow from the bottom electrode towards the free layer, or in other words, the current flows from the bit line 102 through the low resistance electrode 304 and high resistance electrode 306, through the optional tuning layer 302 towards the free layer 214. Since the electrodes 304 and 306 appear in parallel to the current flow, there is a larger magnitude of current flowing through the low resistance path 304, than the high resistance path 306.

In FIG. 4A, the section of the free layer which draws current from the low resistance/high current density path 304 is labeled 304a, and the section of the free layer which draws current from the high resistance/low current density path 306 is labeled 306a. The high current density causes the magnetic elements in 304a to switch at time t1 (as illustrated in FIG. 4B, which shows that the polarization of magnetic elements in 304a is reversed). This reversal transfers the torque from the spin polarized electrons in 304a to the magnetic elements in 306a. Subsequently at a time "t2" (>t1), the polarization of the magnetic elements in 306a are reversed under the interaction of coupling from 304a and the lower density current flowing into 306a from the high resistance path 306. FIG. 4C illustrates the entire free layer 214 with its polarity reversed by the two step process described above. A binary value "1" is said to be written to the MTJ bit cell 300 at time t2.

One of ordinary skill in the art will appreciate that the multi step switching process with non-uniform current flow across the MTJ bit cell, as described above, leads to a more efficient switching activity in the free layer, than a conventional single step switching process with uniform current flow. A multi step switching process involving a combination of a confined high density current path (304) and low density current path (306), utilizes the momentum generated by a first step of switching activity towards a later step of switching activity. A single step switching process does not harness the momentum generated from switching activity within the free layer 214 to beneficially improve efficiency of the switching activity.

FIG. 5A illustrates an exemplary embodiment in which the low resistance electrode 502 forms the inner section of the composite electrode structure, and the high resistance electrode 504 forms an outer surrounding region. Analogous to the embodiment in FIGS. 4A-C, a low resistance/high current density path 502 supplies current to an inner region labeled 502a in the free layer 214, and a high resistance/low current density path 504 supplies current to an outer region labeled 504a in the free layer 214. Magnetic elements in the inner region 502a are caused to switch first due to the high current density. Further to providing a momentum to the magnetic elements in 504a, the high current flowing through the current path 502 also leads to the creation of an Oersted Field 506 in the outer periphery of region 502a as shown in FIG. 5B. The magnetic field created by the Oersted Field effect further helps the switching of magnetic elements in the lower current density region 504a. FIG. 5C illustrates the entire free layer 214 with its polarity reversed by the two step process described above.

While the effects of the Oersted Field are present in exemplary embodiments of both FIGS. 4A-C and FIGS. 5A-C, the effects are more pronounced in the embodiment illustrated in FIGS. 5A-C due to the high current density path through the inner electrode 502.

Methods for fabricating exemplary embodiments of MTJ bit cells with beneficial composite hardmask architectures are described below. FIG. 6 illustrates the process flow for fabricating exemplary embodiments illustrated in FIGS. 4A-C with an inner high resistance electrode 306 and an outer high resistance electrode 304. An MTJ comprising a bottom electrode 202, an AFM layer 204, pinned layers 206, 208 and 210, barrier layer 212 and free layer 214 is formed using conventional techniques. A tuning layer 302 is optionally formed on top of the free layer 214 as shown in FIG. 6A. The role of the tuning layer 302, as described previously, is to protect the free layer 214 from process related damage and also to reduce the damping constant of the free layer. A lower damping constant results in the reduction of switching current density. The tuning layer can be formed of a metal such as Ru, Mg, Hf, Pt, Ir, Al, Zr, V, Cu, Au, Ag, PtMn or a low-resistance compound such as thin-MgO. The free layer 214 may be a single layer formed from a ferromagnetic material, or may include a multi-layer stack, as is well known in the art.

A high resistance electrode 306 is formed on top of the optional tuning layer 302 (or directly on top of the free layer 214 if no tuning layer is present). The high resistance electrode 306 may be formed from a dielectric material such as TaOx or TiOx, or a high resistance compound. A photoresist 602 is formed on top of the high resistance electrode 306. The device is then subjected to an etching process such as $CF_4$ etching to pattern the high resistance electrode 306. Next, the photoresist 602 is removed using a process which may involve oxygen ashing, as shown in FIG. 6B. The tuning layer 302, if present, protects the free layer 214 from damage during etching and oxygen ashing.

Next, the tuning layer 302, if present, may be etched using an etching process such as $CH_3OH$ etching, as shown in FIG. 6C. If no tuning layer is present, the process proceeds to the next step, which involves deposition of a low resistance electrode 304 as shown in FIG. 6D. The low resistance electrode 304 may be formed from a metal such as Ta or Ti, or a low-resistance compound such as TaNx or TiNx.

Next, the MTJ stack 600 is subjected to an etching process such as $CF_4$ etching, to pattern the low resistance electrode, as shown in FIG. 7A. The tuning layer 302, if present, may also be etched at this stage. Alternately, the tuning layer 302, if present, may not be etched, and may thus continue to form a protective layer over the entire top portion of the free layer 214 as illustrated in FIG. 7A. Next, the MTJ stack 600 is patterned down to the bottom electrode 202, using an etching process such as $CH_3OH$ etching, $CO/NH_3$ etching, or etching with a Chlorine-base gas, as shown in FIG. 7B. Next, a dielectric layer is deposited as shown in FIG. 7C. The dielectric layer is then planarized and etched back and a metal layer is deposited using a metallization process. The metal layer or bit line 102 is in contact with the low resistance electrode 304 and the high resistance electrode 306 as shown in FIG. 7D.

Though the process steps described above relate to the formation of an MTJ bit cell according to embodiments depicted in FIGS. 4A-C, one of ordinary skill in the art will recognize that embodiments depicted in FIGS. 5A-C, with an outer high resistance electrode 504 and an inner low resistance electrode 502, may be fabricated using similar process steps with minor modifications. Particularly, a low resistance electrode 504 may be deposited instead of the high resistance electrode 306 in the step illustrated in FIG. 6A. Similarly, a high resistance electrode 502 may be deposited instead of the low resistance electrode layer 304 in the step illustrated in FIG. 6D. The remaining process steps may remain substantially the same.

Figure 8:
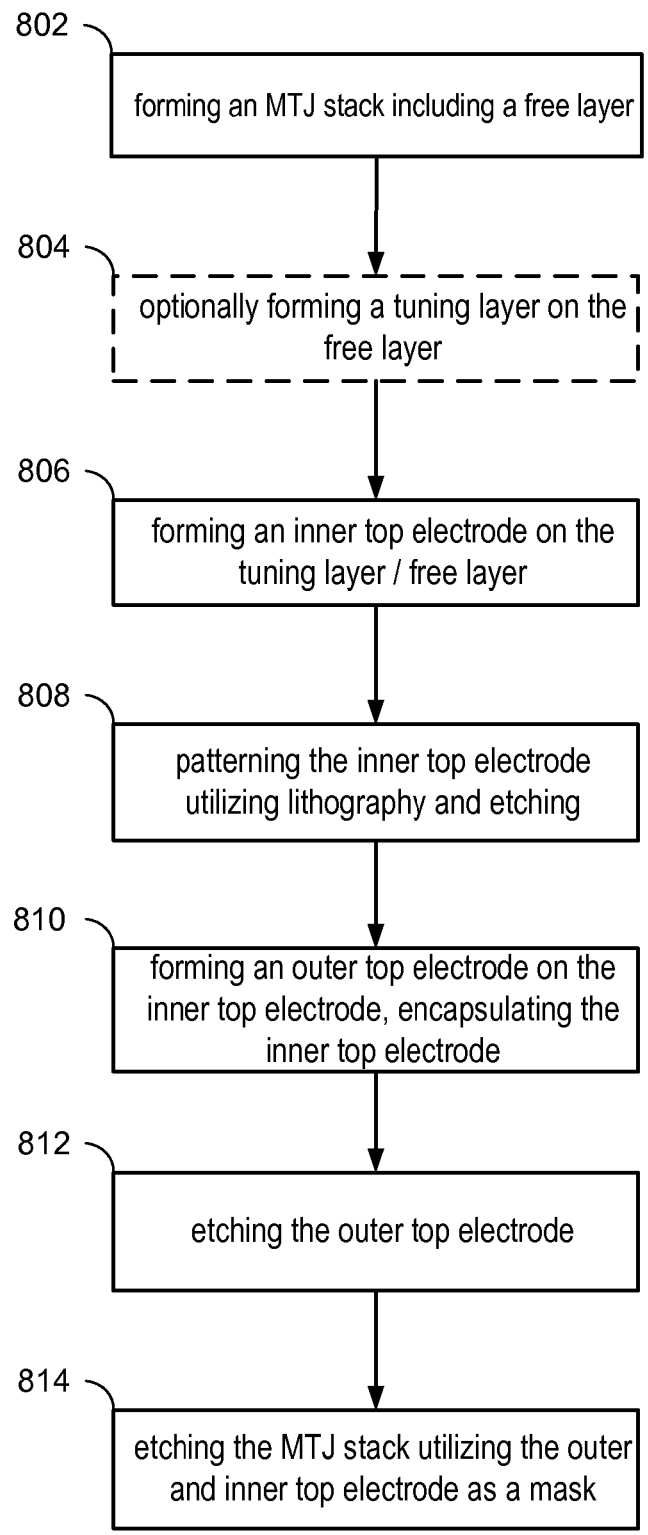
FIG. 8 provides an exemplary flowchart for forming a memory device having a magnetic tunnel junction (MTJ) storage element.

FIG. 8 is a flowchart illustrating an exemplary method for forming a memory device having a magnetic tunnel junction (MTJ) storage element. An MTJ comprising a pinned layer, a barrier layer and a free layer can be formed in 802. In 804 an optional tuning layer may be formed on the free layer. An inner top electrode is formed on the free layer or optional tuning layer in 806. The inner top electrode is patterned utilizing lithography and etched in 808. An outer top electrode is formed on the inner top electrode, encapsulating the inner top electrode in 810. The outer top electrode is etched in 812. The MTJ stack is etched utilizing the outer top electrode and the inner top electrode as a mask in 814. It will be appreciated that the flowchart is not intended to limit the various embodiments and was provided merely to aid in illustration and discussion of the steps detailed.

According to the exemplary methods, an MTJ storage element can be fabricated with a composite top electrode structure as disclosed herein. The exemplary embodiments beneficially promote a non-uniform current path through the MTJ bit cell, which leads to an improved switching behavior and a lower switching current density.

It will be appreciated that memory devices including the MTJ storage elements described herein may be included within a mobile phone, portable computer, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments may be suitably employed in any device which includes active integrated circuitry including memory having MTJ storage elements as disclosed herein.

The foregoing disclosed devices and methods can be designed and can be configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Accordingly, embodiments can include machine-readable media or computer-readable media embodying instructions which when executed by a processor transform the processor and any other cooperating elements into a machine for performing the functionalities described herein as provided for by the instructions.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. A magnetic tunnel junction (MTJ) storage element comprising:
    a pinned layer, a barrier layer and a free layer;
    a top electrode formed on top of the free layer, wherein the top electrode is configured to provide a non-uniform current path through the MTJ storage element, and wherein the top electrode further comprises an inner top electrode and an outer top electrode; and
    a tuning layer formed on top of the free layer, wherein the tuning layer is interspersed between the inner top electrode and the free layer, such that the outer top electrode is in contact with a sidewall portion of the tuning layer and an upper portion of the free layer, encapsulating the tuning layer.

2. The MTJ storage element of claim 1, wherein the top electrode further comprises an inner top electrode and an outer top electrode.

3. The MTJ storage element of claim 2, wherein the resistance of the inner top electrode is less than the resistance of the outer top electrode.

4. The MTJ storage element of claim 2, wherein the resistance of the inner top electrode is greater than the resistance of the outer top electrode.

5. The MTJ storage element of claim 1, wherein the free layer comprises a plurality of magnetic layers.

6. The MTJ storage element according to claim 1, wherein the MTJ storage element integrated into an electronic device, selected from the group consisting of a set top box, music player, video player, entertainment unit, navigation device, mobile phone, portable computer, hand-held personal communication system (PCS) units, communications device, personal digital assistant (PDA), fixed location data unit, and a computer.

7. The MTJ storage element according to claim 1, wherein the MTJ storage element is integrated into a memory device.

8. The memory device according to claim 7, wherein the memory device is a Spin Transfer Torque Magnetoresistive Random Access Memory (STT-MRAM device and wherein the STT-MRAM is integrated in at least one semiconductor die.

9. The MTJ storage element according to claim 1, wherein the resistance of the inner top electrode is less than the resistance of the outer top electrode.

10. The MTJ storage element according to claim 1, wherein the resistance of the inner top electrode is greater than the resistance of the outer top electrode.

11. The MTJ storage element according to claim 1, wherein the tuning layer is formed from at least one of a metallic material, a low resistance compound or a high resistance.

12. The MTJ storage element according to claim 1, wherein the MTJ storage element is integrated into an electronic device, selected from the group consisting of a set top box, music player, video player, entertainment unit, navigation device, mobile phone, portable computer, hand-held personal communication system (PCS) units, communications device, personal digital assistant (PDA), fixed location data unit, and a computer.

13. The MTJ storage element according to claim 1, wherein the MTJ storage element is part of Spin Transfer Torque Magnetoresistive Random Access Memory (STT-MRAM).

14. A magnetic tunnel junction (MTJ) storage element, the method comprising:
    forming an MTJ, comprising a pinned layer, a barrier layer and a free layer;
    forming an inner top electrode on the free layer;
    patterning the inner top electrode utilizing lithography and etching;
    forming an outer top electrode on the inner top electrode, encapsulating the inner top electrode;
    etching the outer top electrode; and
    etching the MTJ utilizing the outer top electrode and the inner top electrode as a mask.

15. The method of claim 14, wherein the inner top electrode is formed of a low resistance material and the outer top electrode is formed of a high resistance material.

16. The method of claim 14, wherein the inner top electrode is formed of a high resistance material and the outer top electrode is formed of a low resistance material.

17. The method according to claim 14, wherein the memory device is integrated into an electronic device, selected from the group consisting of a set top box, music player, video player, entertainment unit, navigation device, mobile phone, portable computer, hand-held personal communication system (PCS) units, communications device, personal digital assistant (PDA), fixed location data unit, and a computer.

18. The method according to claim 14, wherein the memory device is a Spin Transfer Torque Magnetoresistive Random Access Memory (STT-MRAM).

19. The method according to claim 14, further comprising:
forming a tuning layer on the free layer, wherein the tuning layer is interposed between the free layer and the inner top electrode.

20. The method of claim 19, wherein the inner top electrode is formed of a low resistance material and the outer top electrode is formed of a high resistance material.

21. The method of claim 19, wherein the inner top electrode is formed of a high resistance material and the outer top electrode is formed of a low resistance material.

22. The method of claim 19, wherein the tuning layer is formed from at least one of a metallic material, a low resistance compound or high resistance compound.

23. A magnetic tunnel junction (MTJ) storage element comprising:
a vertical stack comprising a bottom conductive means for electrically coupling the MTJ storage element, a first magnetic means for holding a first polarization, first insulating means to facilitate the flow of tunneling current and a second magnetic means for holding a second polarization, wherein the second polarization is reversible;
a top conductive means formed on top of the second magnetic means, wherein the top conductive means is configured to provide a non-uniform current path through the MTJ storage element, and wherein the top conductive means further comprises an inner top conductive means and an outer top conductive means; and
a damping means, for a reducing damping constant of the second magnetic means formed on top of the second magnetic means, wherein the damping means is interspersed between the inner top conductive means and the second magnetic means, such that the outer top conductive means is in contact with a sidewall portion of the damping means and an upper portion of the second magnetic means, encapsulating the damping means.

24. The MTJ storage element of claim 23, wherein a resistance of the inner top conductive means is greater than a resistance of the outer top conductive means.

25. The MTJ storage element of claim 23, wherein a resistance of the outer top conductive means is greater than a resistance of the inner top conductive means.

26. The memory device according to claim 23, wherein the memory device is integrated into an electronic device, selected from the group consisting of a set top box, music player, video player, entertainment unit, navigation device, mobile phone, portable computer, hand-held personal communication system (PCS) units, communications device, personal digital assistant (PDA), fixed location data unit, and a computer.

27. The memory device according to claim 23, wherein the memory device is a Spin Transfer Torque Magnetoresistive Random Access Memory (STT-MRAM).

28. A method of forming memory device having a magnetic tunnel junction (MTJ) storage element, the method comprising:
step for forming an MTJ, comprising a pinned layer, a barrier layer and a free layer;
step for forming an inner top electrode on the free layer;
step for patterning the inner top electrode utilizing lithography and etching;
step for forming an outer top electrode on the inner top electrode, encapsulating the inner top electrode;
step for etching the outer top electrode; and
step for etching the MTJ utilizing the outer top electrode and the inner top electrode as a mask.

29. The method of claim 28, wherein the inner top electrode is formed of a low resistance material and the outer top electrode is formed of a high resistance material.

30. The method of claim 28, wherein the inner top electrode is formed of a high resistance material and the outer top electrode is formed of a low resistance material.

31. The method according to claim 28, wherein the memory device is integrated into an electronic device, selected from the group consisting of a set top box, music player, video player, entertainment unit, navigation device, mobile phone, portable computer, hand-held personal communication system (PCS) units, communications device, personal digital assistant (PDA), fixed location data unit, and a computer.

32. The method according to claim 28, wherein the memory device is a Spin Transfer Torque Magnetoresistive Random Access Memory (STT-MRAM).

33. The method according to claim 28, further comprising:
step for forming a tuning layer on the free layer, wherein the tuning layer is interposed between the free layer and the inner top electrode.

34. The MTJ storage element of claim 1, wherein the top electrode is coupled to a bit line, such that the top electrode is configured to convert uniform current from the bit line into non-uniform current.

35. The MTJ storage element of claim 32, wherein the inner top conductive means and the outer top conductive means are coupled to a bit line, uniform current from the bit line into non-uniform current passing through the electrically parallel arrangement of the inner top conductive means and the outer top conductive means.

* * * * *